(12) United States Patent
Alvarado et al.

(10) Patent No.: US 9,699,941 B2
(45) Date of Patent: Jul. 4, 2017

(54) INTERCHANGEABLE FAN SUPPORT MEMBER PROVIDING LATERAL, STRUCTURAL SUPPORT FOR SERVER CHASSIS

(71) Applicant: DELL PRODUCTS, L.P., Round Rock, TX (US)

(72) Inventors: Daniel Alvarado, Pflugerville, TX (US); Edmond I. Bailey, Cedar Park, TX (US); Walter R. Carver, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 14/675,116

(22) Filed: Mar. 31, 2015

(65) Prior Publication Data

US 2016/0295746 A1    Oct. 6, 2016

(51) Int. Cl.
*H05K 7/20* (2006.01)
*G06F 1/20* (2006.01)
*G06F 1/18* (2006.01)

(52) U.S. Cl.
CPC ......... *H05K 7/20727* (2013.01); *G06F 1/181* (2013.01); *G06F 1/20* (2013.01)

(58) Field of Classification Search
CPC ............. H01L 23/467; H01L 21/67173; H01L 21/6719; H01L 21/67196; G06F 1/20; G06F 2200/201; G06F 1/183; G06F 1/181; H05K 7/20172; H05K 7/20736; H05K 7/20727; H05K 7/20581; H05K 7/20145; H05K 7/20209; H05K 7/20572; H05K 7/20563; H05K 7/20718; H05K 7/20754; H05K 7/20136; H05K 7/20909; H05K 7/20
USPC ........................ 361/679.48–679.51, 690–697
See application file for complete search history.

(56) References Cited

U.S. PATENT DOCUMENTS

| | | |
|---|---|---|
| 4,597,291 A | 7/1986 | Motomiya |
| 5,229,919 A | 7/1993 | Chen |
| 5,349,483 A | 9/1994 | Tsai |
| 5,650,911 A | 7/1997 | Scholder et al. |
| 5,680,293 A | 10/1997 | McAnally et al. |

(Continued)

OTHER PUBLICATIONS

Wright, Ingrid D., Requirement for Restriction/Election, U.S. Appl. No. 14/672,845, The United States Patent and Trademark Office, Jul. 14, 2016.

*Primary Examiner* — Adam B Dravininkas
(74) *Attorney, Agent, or Firm* — Isidore PLLC (57) ABSTRACT

A chassis of an information handling system (IHS) includes a lateral segment that spans across a directional path of air travelling from an air intake side to an air exhaust side and including receiving affordances for insertion of a lateral support for a directional air mover. A user can select one of a first lateral support and a second lateral support that is insertable into the lateral segment and securable to the receiving affordances. The first lateral support has apertures of a first size to receive respective first fan modules and the second lateral support has apertures of a second size to receive respective second fan modules. An inserted one of the first and second lateral supports is selected based on a cooling air requirement corresponding to user selected compute components placed within the chassis to operate within the IHS.

20 Claims, 5 Drawing Sheets

(56) References Cited

U.S. PATENT DOCUMENTS

| | | |
|---|---|---|
| 5,687,059 A | 11/1997 | Hoppal |
| 5,734,557 A | 3/1998 | McAnally et al. |
| 5,783,771 A | 7/1998 | Copeland et al. |
| 5,858,509 A | 1/1999 | Polch et al. |
| 5,865,518 A | 2/1999 | Jarrett et al. |
| 5,967,633 A | 10/1999 | Jung |
| 5,995,365 A | 11/1999 | Broder et al. |
| 6,122,165 A | 9/2000 | Schmitt et al. |
| 6,125,031 A | 9/2000 | Fiora et al. |
| 6,195,262 B1 | 2/2001 | Bodette et al. |
| 6,201,702 B1 | 3/2001 | Schmitt |
| 6,297,962 B1 | 10/2001 | Johnson et al. |
| 6,349,353 B1 | 2/2002 | Lewis et al. |
| 6,351,375 B1 | 2/2002 | Hsieh et al. |
| 6,404,642 B1 | 6/2002 | Greenfield et al. |
| 6,496,366 B1 | 12/2002 | Coglitore et al. |
| 6,580,604 B1 | 6/2003 | McAnally et al. |
| 6,600,648 B2 | 7/2003 | Curlee et al. |
| 6,625,033 B1 | 9/2003 | Steinman |
| 6,674,641 B2 | 1/2004 | Jensen et al. |
| 6,675,976 B2 | 1/2004 | Steinman et al. |
| 6,788,542 B2 | 9/2004 | Rumney |
| 6,826,048 B1 | 11/2004 | Dean et al. |
| 6,839,233 B2 | 1/2005 | Cravens et al. |
| 6,851,925 B2 | 2/2005 | Chuang |
| 6,854,174 B2 | 2/2005 | Jiang |
| 6,906,918 B2 | 6/2005 | Rabinovitz |
| 7,123,474 B2 | 10/2006 | Cho |
| 7,151,672 B2 | 12/2006 | Campbell |
| 7,245,490 B2 * | 7/2007 | Chou .................... F04D 29/601 361/694 |
| 7,259,962 B2 | 8/2007 | Chen |
| 7,262,958 B2 | 8/2007 | Marroquin et al. |
| 7,453,707 B2 | 11/2008 | Beall et al. |
| 7,483,264 B2 | 1/2009 | Chen et al. |
| 7,545,636 B2 | 6/2009 | Wobig et al. |
| 7,580,260 B2 | 8/2009 | Figuerado |
| 7,589,966 B2 | 9/2009 | Ong et al. |
| 7,606,044 B2 | 10/2009 | Bailey et al. |
| 7,623,344 B2 | 11/2009 | Beall et al. |
| 7,639,486 B2 | 12/2009 | Champion et al. |
| 7,821,790 B2 | 10/2010 | Sharma et al. |
| 7,845,903 B2 * | 12/2010 | Li .............................. G06F 1/20 415/186 |
| 7,909,312 B2 | 3/2011 | Ogata |
| 8,045,339 B2 | 10/2011 | Pav |
| 8,116,076 B2 | 2/2012 | Cochrane |
| 8,363,414 B2 | 1/2013 | Peng et al. |
| 8,411,432 B1 | 4/2013 | Zimlin et al. |
| 8,427,828 B2 | 4/2013 | Kehret et al. |
| 8,437,133 B2 | 5/2013 | Bhutani et al. |
| 8,451,600 B1 | 5/2013 | Ross |
| 8,665,590 B2 | 3/2014 | Wang |
| 8,755,192 B1 | 6/2014 | Schrempp et al. |
| 8,757,739 B2 | 6/2014 | Chen et al. |
| 8,787,013 B1 | 7/2014 | Czamara et al. |
| 2003/0016504 A1 | 1/2003 | Raynham |
| 2005/0185370 A1 | 8/2005 | Chung |
| 2005/0257232 A1 | 11/2005 | Hidaka |
| 2006/0120040 A1 * | 6/2006 | Chen ........................ G06F 1/20 361/695 |
| 2006/0120041 A1 * | 6/2006 | Chen ........................ G06F 1/20 361/695 |
| 2006/0274498 A1 | 12/2006 | Chen |
| 2008/0253077 A1 | 10/2008 | Miyamoto et al. |
| 2009/0009961 A1 * | 1/2009 | Li .............................. G06F 1/20 361/679.48 |
| 2009/0021911 A1 * | 1/2009 | Lee ....................... F04D 29/601 361/695 |
| 2009/0021912 A1 * | 1/2009 | Yin ........................... G06F 1/20 361/695 |
| 2009/0152216 A1 | 6/2009 | Champion et al. |
| 2009/0257187 A1 | 10/2009 | Mills et al. |
| 2010/0026148 A1 | 2/2010 | Zhang et al. |
| 2010/0061051 A1 | 3/2010 | Cochrane |
| 2010/0177487 A1 | 7/2010 | Arshad et al. |
| 2010/0232976 A1 * | 9/2010 | Li ...................... H05K 7/20172 416/244 R |
| 2012/0010754 A1 * | 1/2012 | Matteson ........... H05K 7/20836 700/282 |
| 2012/0063080 A1 | 3/2012 | Chou |
| 2012/0113591 A1 * | 5/2012 | Chuang .............. H05K 7/20172 361/695 |
| 2012/0219413 A1 | 8/2012 | Charest |
| 2012/0327599 A1 * | 12/2012 | Dickinson .............. F04D 25/166 361/695 |
| 2013/0099645 A1 | 4/2013 | Hsieh et al. |
| 2013/0265725 A1 | 10/2013 | Harvilchuck |
| 2014/0055934 A1 | 2/2014 | Wu et al. |
| 2014/0086732 A1 * | 3/2014 | Kelaher ............. H05K 7/20145 415/175 |
| 2014/0108692 A1 | 4/2014 | Doglio et al. |
| 2014/0113539 A1 * | 4/2014 | Dickinson .......... H05K 7/20581 454/184 |
| 2014/0211418 A1 | 7/2014 | Arreola |
| 2014/0376172 A1 | 12/2014 | Love et al. |
| 2015/0366096 A1 | 12/2015 | Bailey et al. |

\* cited by examiner

INTERCHANGEABLE FAN SUPPORT MEMBER PROVIDING LATERAL, STRUCTURAL SUPPORT FOR SERVER CHASSIS

BACKGROUND

1. Technical Field

This disclosure generally relates to information handling systems (IHS), and more particular to a configurable chassis and air mover modular assembly to support varied cooling needs of a modularly-assembled IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

An original equipment manufacturer (OEM) of IHSes often assembles an IHS such as an individual server or a rack assembly of a number of rack servers. The OEM then ships the assembled individual server or the rack-assembled IHS to an end user destination. Often these IHSes are built to order. Numerous industry conditions can preclude assembling any particular configuration before an order is received from an end user. For example, the processor and other computer technology are rapidly evolving, the cost of certain compute components used in an IHS is subject to volatility, and customer requirements can have great variability. One implication of waiting for customer orders is that the utilization efficiency of the workforce at the OEM is subject to the vagaries in the amount of orders received.

Some end users are sophisticated in their understanding of IHSes and invest in a large number of IHSes for a data center facility. A large order can create a correspondingly large manufacturing delay at the OEM. However, the end user may have the space and personnel required to configure their IHSes onsite. Further, the end user may also have some motivation to select particular compute components to be used within the IHS. In addition, similar considerations can be applicable after deployment of the IHS, particularly for continued servicing and upgrading of the IHSes. The end user may prefer to order chasses and compute components that can be economically and quickly shipped.

Generally, a chassis of an IHS is designed for a particular configuration of air movers to cool functional computer components provisioned in the chassis. The configuration of functional computer components needs to be consistent with the size and number of air mover modules that can be installed in the chassis. User selection of functional computer components at the destination can create configurations that are not appropriate for the amount of cooling provided by the chassis and its support infrastructure. Too much cooling wastes resources. Too little cooling can create reduced service life and unacceptable system unavailability. Thus, configuration of the IHS by the user can be limited.

BRIEF SUMMARY

The illustrative embodiments of the present disclosure provide a chassis of an information handling system (IHS) that includes a base wall and attached lateral sides defining a bottom partial enclosure with an air intake side and an opposing air exhaust side. A lateral segment of the base wall spans across a directional path of air travelling from the air intake side to the air exhaust side and includes receiving affordances/mechanisms for insertion of a lateral support for a directional air mover. A user-selectable one of a first lateral support and a second lateral support is inserted into the lateral segment and secured to the receiving affordances. Each of the first and second lateral supports is attachable laterally across the lateral segment. The first lateral support has apertures of a first size to receive respective first fan modules. The second lateral support has apertures of a second size to receive respective second fan modules. An inserted one of the first and second lateral supports is selected based on a cooling air requirement corresponding to user selected compute components placed within the chassis to operate within the IHS.

According to at least one aspect of the present disclosure, an IHS includes selected compute components that have varying cooling air requirements. The IHS includes a chassis configured with the infrastructure components arranged for housing the selected compute components. In one or more embodiments, the chassis includes a base wall and attached lateral sides defining a bottom partial enclosure with an air intake side and an opposing air exhaust side. A lateral segment spans across a directional path of air travelling from the air intake side to the air exhaust side and including receiving affordances for insertion of a lateral support for a directional air mover A user-selectable one of a first lateral support and a second lateral support is inserted into the lateral segment and secured to the receiving affordances. Each of the first and second lateral supports is attachable laterally across the lateral segment. The first lateral support has apertures of a first size to receive respective first fan modules. The second lateral support has apertures of a second size to receive respective second fan modules. An inserted one of the first and second lateral supports is selected based on a cooling air requirement corresponding to user selected compute components placed within the chassis to operate within the IHS.

According to at least one aspect of the present disclosure, a method is provided of manufacturing support structures for downstream assembly of a chassis that is designed to be provisioned with selected compute components that have varying cooling air requirements to form a fully functional IHS. In one or more embodiments, the method includes making a bottom segment having a base wall attached between lateral sides and between an air intake side and an opposing air exhaust side. The base wall has a lateral space with attachment features for receiving one of a first and second lateral support. The first lateral support has apertures of a first size to receive respective first fan modules. The second lateral support has apertures of a second size to receive respective second fan modules. The fan modules and corresponding lateral support can thus be end user selected based on a cooling air requirement corresponding to the selected compute components.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

According to one or more embodiments, an Information Handling System (IHS) has a lateral member within the chassis that supports a specific size air mover such as a fan, based on the cooling requirements of the inserted information technology (IT) gear. The lateral member serves to provide structural support to the chassis and can be interchangeably replaced with a different lateral member that has the same length and same connection affordances, but different girth and/or structure that supports a different size air mover. Air movers such as fan modules can this be interchangeable components in the same server chassis based on specific cooling needs of the IT gear being inserted into the modularly interchangeable IT section of the chassis.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
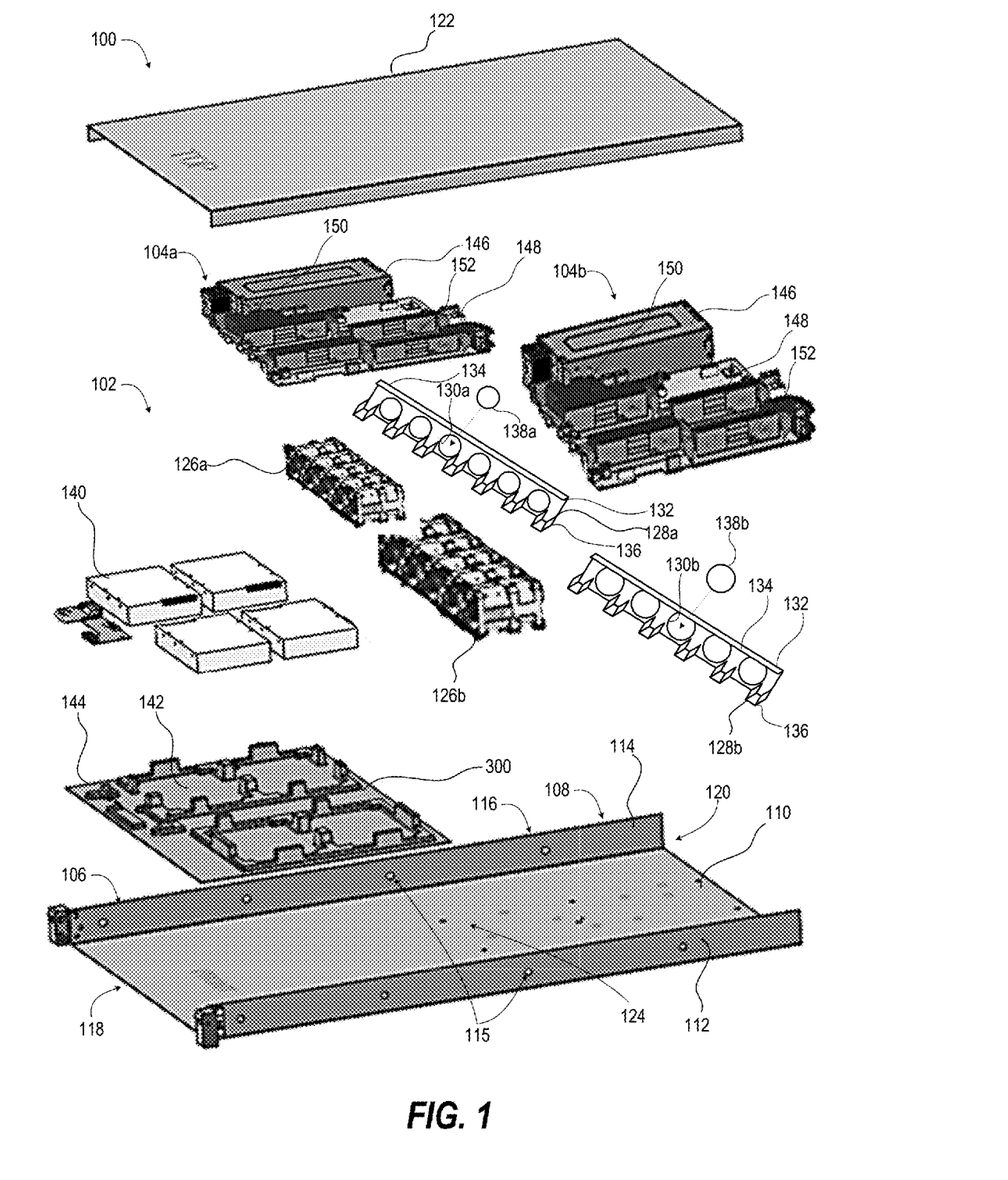
FIG. 1 illustrates a perspective view of a disassembled information handling system (IHS) with configurable components, according to one or more embodiments.

FIG. 1 illustrates an IHS 100 that includes selected compute components 102 that have varying cooling air requirements. For clarity, the selected compute components 102 can be end-user selected and can have one or more different configurations of functional compute components having varying cooling requirements. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

In the illustrative embodiment of FIG. 1, IHS 100 includes a first configuration 104a of functional compute components that has a first level of cooling requirement and a second configuration 104b of functional compute components. A chassis 106 is configured with the infrastructure components 108 that are arranged for housing the selected compute components 102. The infrastructure components 108 of the chassis 106 include a base wall 110 and attached lateral sides 112, 114 that define a bottom partial enclosure 116 having an air intake side 118 and an opposing air exhaust side 120 (i.e., located on the opposite open side of the chassis from the air intake side 118). A cover 122 can be engaged to the bottom partial enclosure 116 to channel air flow through the chassis 106. A lateral segment 124 of the bottom partial enclosure 116 spans across a directional path of air travelling from the air intake side 118 to the air exhaust side 120 and includes one or more receiving affordances/structures 115 for insertion of a lateral support for inserted one or more directional air movers. Within the illustrative embodiment, the directional air movers are depicted as including fan modules 126a of a first size and fan modules 126b of a second size. For clarity, only two fan sizes are shown, although embodiments consistent with the present innovation may include more sizes. For example, the first size can be 40 mm, the second size can be 60 mm, and another size can be a module that contains blowers.

For clarity, a user-selectable one of a first lateral support 128a and a second lateral support 128b are inserted into the lateral segment 124 and secured to the receiving affordances. The first lateral support 128a has apertures 130a of a first size to receive respective first fan modules 126a and the second lateral support 128b has apertures 130b of a second size to receive respective second fan modules 126b. The first lateral support 128a and/or the corresponding apertures 130a can have specific dimensions (e.g., a first width or height) that correspond to the one or more dimensions or configurations of the first fan modules 126a and the second lateral support 128b and/or the corresponding apertures 130b can have specific second dimensions that corresponds to one or more dimension or configurations of the second fan modules 126b. Each of the first and second lateral supports 128a, 128b are attachable laterally across the lateral segment 124. An inserted one of the first and second lateral supports 128a, 128b is selected based on a cooling air requirement corresponding to user selected compute components 102 placed within the chassis 106 to form the IHS 100.

In an exemplary embodiment, each of the first and second lateral supports 128a, 128b can be a lateral stiffening structure 132 for the bottom partial enclosure 116. The lateral stiffening structure 132 can include a bracket 134 attachable at each lateral end to the base wall 110. The lateral stiffening structure 132 can include more than one partitioning component 136 that are each perpendicularly attached at a top end to the bracket 134 and extend down to be supportable by the base wall 110 of the chassis 106. The one or more apertures 130a, 130b are defined under the bracket 134, above the base wall 110, and between a respective pair of partitioning components 136.

In one or more embodiments, the first and second lateral supports 128a, 128b each include interconnecting electrical/power and communication cabling (see 207, FIGS. 4 and 5) that extends between each aperture 130a, 130b and other components located on the chassis 106 of the IHS 100 to respectively channel power to and to communicate feedback and control signals from and to the respective one of the first and second fan modules 126a, 126b. The installed one of the first and second fan modules 126a, 126b then operates to channel cooling air through the chassis 106 between the air intake and air exhaust sides 118, 120.

In one embodiment, a first blank 138a is provided to close the aperture 130a of the first lateral support 128a that is not occupied by a first fan module 126a. Similarly, a second blank 138b is provided to close an aperture 130b of the second lateral support 128b that is not occupied by a second fan module 126b. The blanks 138a, 138b are sized to fit the appropriate one of the apertures 130a, 130b.

Selectable compute components 102 having different cooling requirements can include, without limitation, storage drives 140 that are received in slots 142 of a support member 144, power supply units 146, memory modules 148, processors 150 and motherboards 152.

Figure 2:
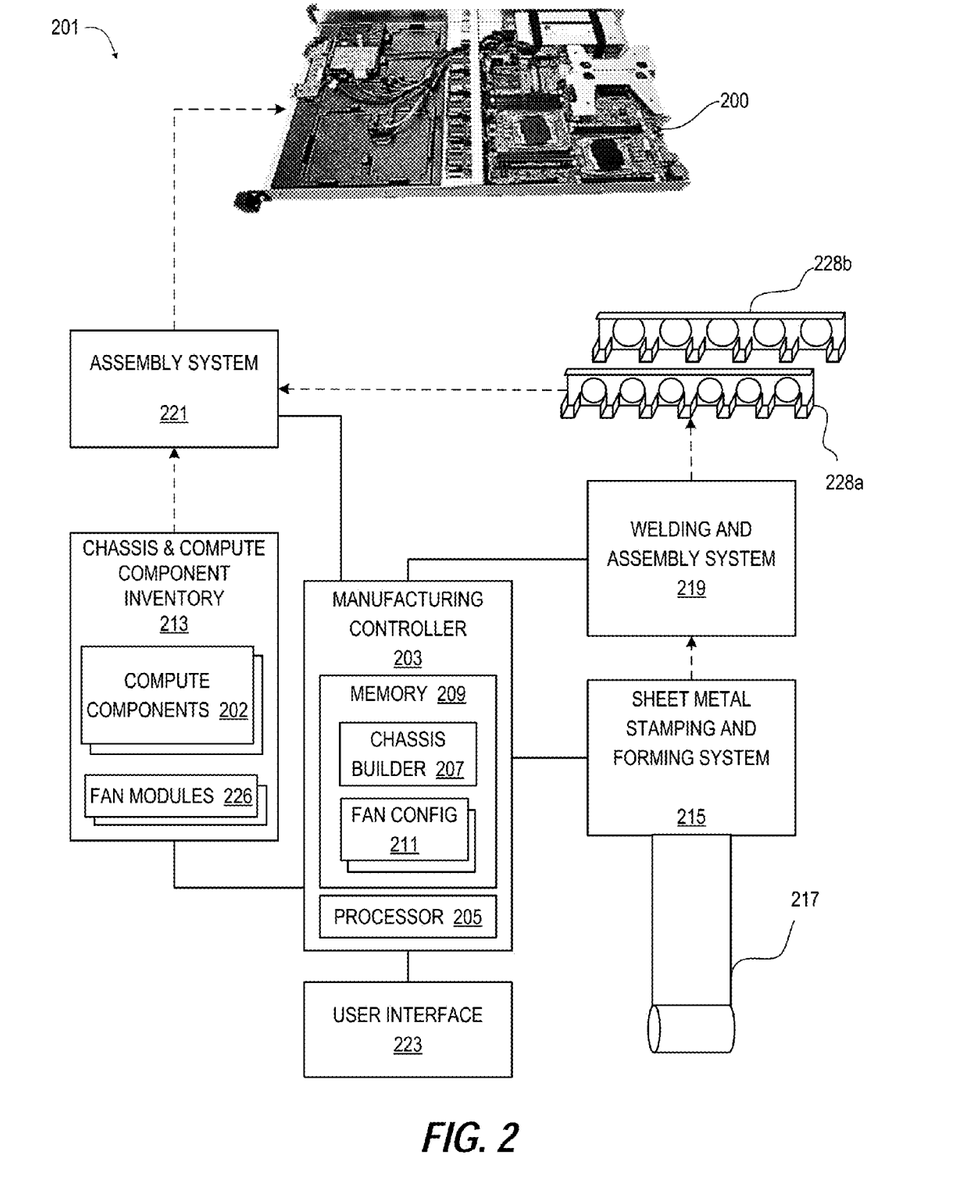
FIG. 2 illustrates a conceptual diagram of a manufacturing system for fabricating and assembling the IHS of FIG. 1, according to one or more embodiments.

FIG. 2 illustrates a manufacturing system 201 for fabricating and assembling an IHS 200. A manufacturing controller 203 includes a processor 205 that executes a chassis builder utility 207 that is resident in memory 209 to design and/or build a specific lateral support according to a selected fan configuration 211. For clarity, the manufacturing controller 203 can control all of the automated processes to fabricate lateral supports 228a, 228b. In one embodiment, the manufacturing controller 203 can also direct assembly of the IHS 200 from functional compute components 202 and fan modules 226 obtainable from a chassis and compute component inventory 213. The manufacturing controller 203 can direct a sheet metal stamping and forming system 215 to convert rolled sheet metal 217 into individual elements that are joined in a welding and assembly system 219 to selectively form the lateral supports 228a, 228b. The manufacturing controller 203 can direct an assembly system 221 to assemble the compute components 202, fan modules 226, and the lateral supports 228a, 228b. In one or more embodiments, portions of the manufacturing system 201 can be distributed. A user interface 223 can allow a user to interact with the manufacturing controller 203 and make selections or provide data related to the specific compute components and size of fans required for the IHS 200.

Figure 3:
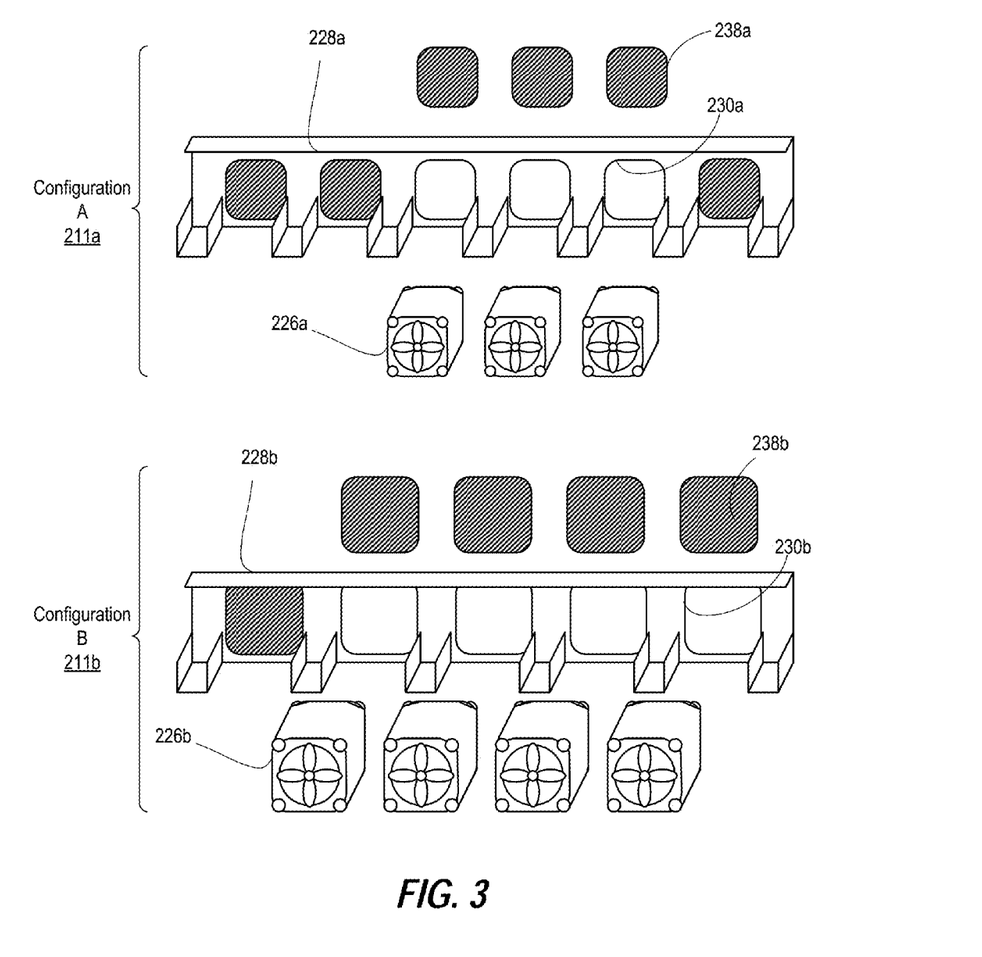
FIG. 3 illustrates a perspective view of two lateral supports for air mover modules of two different sizes that correspond to the cooling requirements of the user selectable configurable components of the IHS, according to one or more embodiments.

FIG. 3 illustrates the two lateral supports 228a, 228b for fan modules 226a, 226b of two different sizes that each correspond to the different cooling requirements of the different selections of the selectable configurable components during design and assembly of the IHS 200 (FIG. 2). In one embodiment, blanks 238a, 238b are initially provided in each aperture and can be removed from apertures 230a, 230b to allow insertion of the specific number of fan modules 226a, 226b selected to respectively form fan configurations 211a, 211b.

It is appreciated that while each lateral support 228a, 228b and corresponding fan configuration 211a, 211b are illustrated as containing a number of the same size of fan, hybrid configurations are also possible within the scope of the disclosure and can be covered in alternate embodiments. For example, with an assembled IHS having a cross section that includes different types of installed computer components requiring a different amount of air cooling, different sizes of fans can be supplied via use of a lateral support having multiple different sizes of apertures to support different sizes or ratings of fans.

Figure 4:
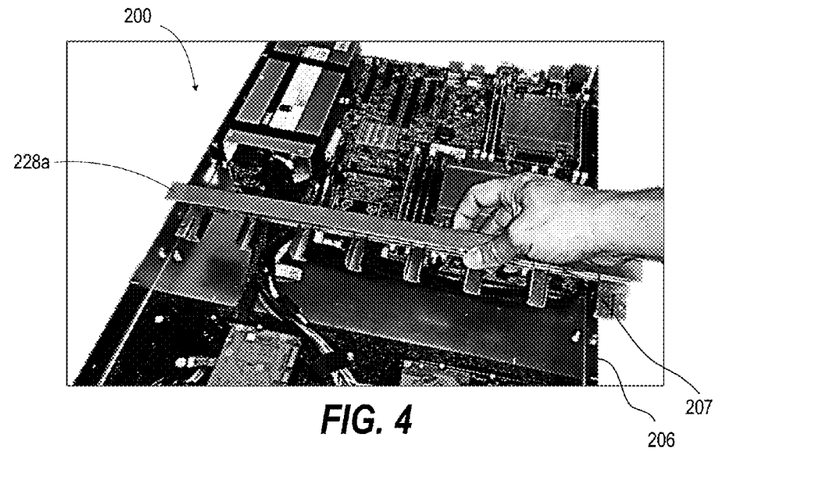
FIG. 4 illustrates a perspective view of a lateral support removed from a chassis of an example IHS, according to one or more embodiments.
Figure 5:
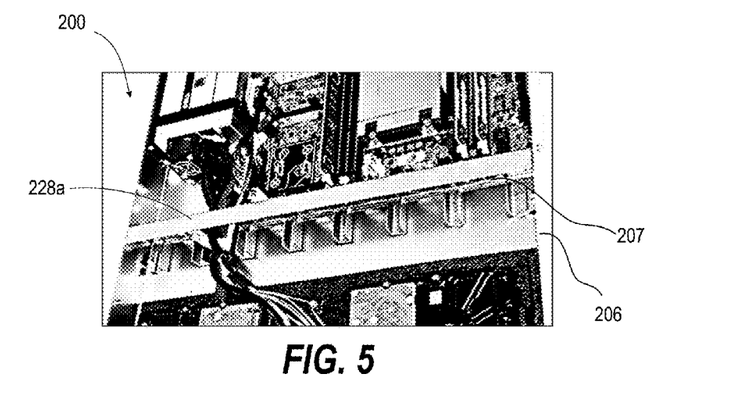
FIG. 5 illustrates a perspective view of the lateral support installed in the chassis of the example IHS of FIG. 4, according to one or more embodiments.
Figure 6:
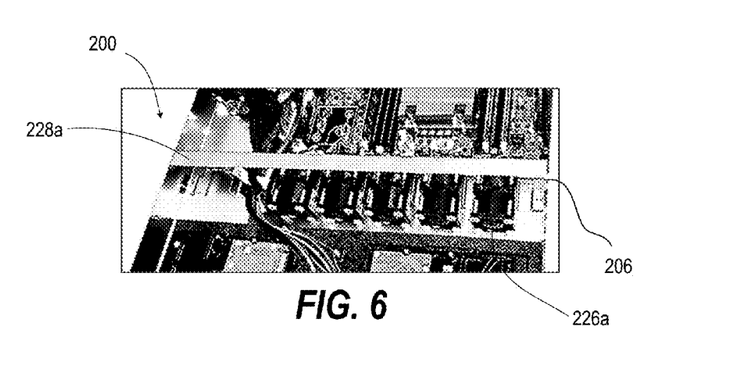
FIG. 6 illustrates a perspective view of air mover modules installed into the lateral support of the example IHS of FIG. 5, according to one or more embodiments.

FIG. 4 illustrates a lateral support 228a removed from a chassis 206 of an example IHS 200, according to one or more embodiments. FIG. 5 illustrates the lateral support 228a installed in the chassis 206 of the example IHS 200 of FIG. 4. FIG. 6 illustrates fan modules 226a installed into the lateral support 228a that in turn is installed in the chassis 206 of the example IHS 200.

Figure 7:
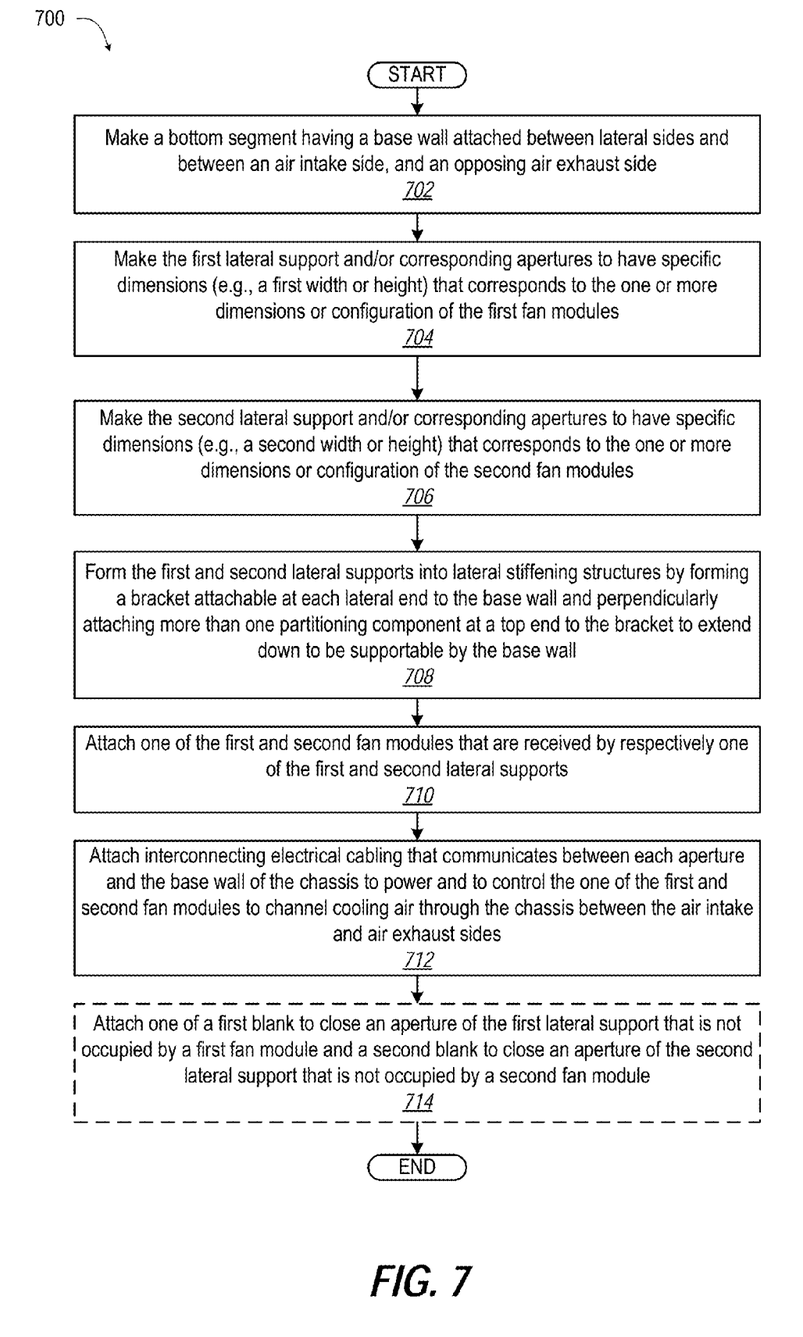
FIG. 7 illustrates a flow diagram of a method of manufacturing a user selectable lateral support for a chassis of an IHS, according to one or more embodiments.

FIG. 7 illustrates a method 700 of manufacturing support structures for downstream assembly of a chassis that can be provisioned with selected compute components that have varying cooling air requirements to form a fully functional IHS. Method 700 begins at start block. In one or more embodiments, the method 700 includes making a bottom segment having a base wall attached between lateral sides and between an air intake side, and an opposing air exhaust side (block 702). The bottom section has a lateral space with attachment features for receiving one of a first and second lateral supports. The first lateral support has apertures of a first size to receive respective first fan modules. The second lateral support has apertures of a second size to receive respective second fan modules. The fan modules and corresponding lateral support can thus be end user selected for a cooling air requirement that corresponds to user selected compute components. The method 700 includes making at least one of (i) the first lateral support and/or corresponding apertures to have specific dimensions (e.g., a first width or height) that corresponds to the one or more dimensions or configuration of the first fan modules (block 704) and (ii) the second lateral support and/or corresponding apertures to have specific dimensions (e.g., a second width or height) that corresponds to the one or more dimensions or configuration of the second fan modules (block 706). The method 700 includes forming the first and second lateral supports to include lateral stiffening structures. In one or more embodiments, the method 700 includes forming a lateral stiffening structure of a bracket attachable at each lateral end to the base wall. The method 700 includes forming a lateral stiffening structure by attaching more than one partitioning component at a top end to the bracket to extend down to be supportable by the base wall. The one or more apertures 130a, 130b (FIG. 1) are defined under the bracket 128a, 128b (FIG. 1), above the base wall 110 of the chassis 106 (FIG. 1), and between a respective pair of partitioning components 136 (FIG. 1) (block 708). The method 700 includes attaching one of the first and second fan modules that are respectively received by one of the first and second lateral supports (block 710). The method 700 includes attaching interconnecting electrical cabling 207 (FIGS. 4 and 5) that communicates between each aperture and the base wall of the chassis to power and to control the one of the first and second fan modules to channel cooling air through the chassis between the air intake and air exhaust sides (block 712). The method 700 can optionally include attaching one of a first blank to close an aperture of the first lateral support that is not occupied by a first fan module and a second blank to close an aperture of the second lateral support that is not occupied by a second fan module (block 714). In one embodiment, the method 700 can alternatively include forming the lateral supports to include the blanks in each aperture that are later removed when installing a fan module. For example, the blanks may be frangibly attached. Then method 700 ends.

In the above described flow chart of FIG. 7, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A chassis of an information handling system (IHS), the chassis comprising:
   a base wall and attached lateral sides defining a bottom partial enclosure with an air intake side and an opposing air exhaust side;
   a lateral segment spanning across a directional path of air travelling from the air intake side to the air exhaust side and including receiving affordances for insertion of a lateral support for a directional air mover; and
   a user-selectable one of a first lateral support and a second lateral support inserted into the lateral segment and secured to the receiving affordances, the first lateral support having apertures of a first size to receive respective first fan modules and the second lateral support having apertures of a second size to receive respective second fan modules, wherein each of the first and second lateral supports are attachable laterally across the lateral segment and an inserted one of the first and second lateral supports is selected based on a cooling air requirement corresponding to user selected compute components placed within the chassis to operate within the IHS;
   wherein the first and second lateral supports each comprise interconnecting electrical cabling that communicates between each aperture and the base wall of the chassis to power and to control the one of the first and second fan modules to channel cooling air through the chassis between the air intake and air exhaust sides.

2. The chassis of claim 1, wherein the first lateral support comprises a first specific dimension that corresponds to the first fan modules and the second lateral support comprises a second specific dimension that corresponds to the second fan modules.

3. The chassis of claim 1, wherein each of the first and second lateral supports comprise a lateral stiffening structure.

4. The chassis of claim 3, wherein the lateral stiffening structure comprises:
   a bracket attachable at each lateral end to the base wall; and
   more than one partitioning component that are each perpendicularly attached at a top end to the bracket and extend down to be supportable by the base wall; and
   wherein the one or more apertures are defined under the bracket, above the base wall, and between a respective pair of partitioning components.

5. The chassis of claim 4, further comprising one of the first and second fan modules that are received by respectively one of the first and second lateral supports.

6. The chassis of claim 1, further comprising a first blank that is sized to close an aperture of the first lateral support that is not occupied by a first fan module and a second blank that is sized to close an aperture of the second lateral support that is not occupied by a second fan module.

7. An information handling system (IHS) comprising:
   selected compute components that have varying cooling air requirements; and
   a chassis configured with the infrastructure components arranged for housing the selected compute components, the chassis comprising:
   a base wall and attached lateral sides defining a bottom partial enclosure with an air intake side and an opposing air exhaust side;
   a lateral segment spanning across a directional path of air travelling from the air intake side to the air exhaust side and including receiving affordances for insertion of a lateral support for a directional air mover; and
   a user-selectable one of a first lateral support and a second lateral support inserted into the lateral segment and secured to the receiving affordances, the first lateral support having apertures of a first size to receive respective first fan modules and the second lateral support having apertures of a second size to receive respective second fan modules, wherein each of the first and second lateral supports are attachable laterally across the lateral segment and an inserted one of the first and second lateral supports is selected based on a cooling air requirement corresponding to user selected compute components placed within the chassis to operate within the IHS;
   wherein the first and second lateral supports each comprise interconnecting electrical cabling that communicates between each aperture and the base wall of the chassis to power and to control the one of the first and second fan modules to channel cooling air through the chassis between the air intake and air exhaust sides.

8. The IHS of claim 7, wherein the first lateral support comprises a first specific dimension that corresponds to the first fan modules and the second lateral support comprises a second specific dimension that corresponds to the second fan modules.

9. The IHS of claim 7, wherein each of the first and second lateral supports comprise a lateral stiffening structure.

10. The IHS of claim 9, wherein the lateral stiffening structure comprises:
    a bracket attachable at each lateral end to the base wall; and
    more than one partitioning component that are each perpendicularly attached at a top end to the bracket and extend down to be supportable by the base wall; and
    wherein the one or more apertures are defined under the bracket, above the base wall, and between a respective pair of partitioning components.

11. The IHS of claim 10, further comprising one of the first and second fan modules that are received by respectively one of the first and second lateral supports.

12. The IHS of claim 7, further comprising a first blank that is sized to close an aperture of the first lateral support that is not occupied by a first fan module and a second blank that is sized to close an aperture of the second lateral support that is not occupied by a second fan module.

13. A method of manufacturing support structures for downstream assembly of a chassis that is designed to be provisioned with selected compute components that have varying cooling air requirements to form a fully functional IHS, the method comprising:
    making a bottom segment having a base wall attached between lateral sides and between an air intake at a first side, and an air exhaust at a second side and having a lateral space with attachment features for receiving one of a first lateral support that has apertures of a first size to receive respective first fan modules and a second lateral support that has apertures of a second size to receive respective second fan modules that are end user selected for a cooling air requirement that corresponds to user selected compute components;

wherein the first and second lateral supports each comprise interconnecting electrical cabling that communicates between each aperture and the base wall of the chassis to power and to control the one of the first and second fan modules to channel cooling air through the chassis between the air intake and air exhaust sides.

14. The method of claim 13, further comprising making the first lateral support that has apertures of the first size to receive respective first fan modules.

15. The method of claim 14, further comprising making the second lateral support that has apertures of the second size to receive respective second fan modules.

16. The method of claim 15, wherein the first lateral support comprises a first specific dimension that corresponds to the first fan modules and the second lateral support comprises a second specific dimension that corresponds to the second fan modules.

17. The method of claim 15, wherein making each of the first and second lateral supports comprises forming a lateral stiffening structure.

18. The method of claim 17, wherein forming the lateral stiffening structure comprises:

forming a bracket attachable at each lateral end to the base wall; and perpendicularly attaching more than one partitioning component at a top end to the bracket to extend down to be supportable by the base wall; and wherein the one or more apertures are defined under the bracket, above the base wall, and between a respective pair of partitioning components.

19. The method of claim 15, further comprising attaching one of a first blank to close an aperture of the first lateral support that is not occupied by a first fan module and a second blank to close an aperture of the second lateral support that is not occupied by a second fan module.

20. The method of claim 13, further comprising attaching one of the first and second fan modules that are received by respectively one of the first and second lateral supports.

* * * * *